US012405570B2

United States Patent
Bayan et al.

(10) Patent No.: US 12,405,570 B2
(45) Date of Patent: Sep. 2, 2025

(54) METHOD AND DEVICE FOR COMPENSATING SURFACE ERROR OF HOLOGRAPHIC GRATING SUBSTRATE

(71) Applicant: Changchun Institute Of Optics, Fine Mechanics And Physics, Chinese Academy Of Sciences, Changchun (CN)

(72) Inventors: Heshig Bayan, Changchun (CN); Shan Jiang, Changchun (CN); Yubo Li, Changchun (CN); Zhaowu Liu, Changchun (CN); Wei Wang, Changchun (CN); Wenhao Li, Changchun (CN); Shuo Li, Changchun (CN); Yanxiu Jiang, Changchun (CN)

(73) Assignee: CHANGCHUN INSTITUTE OF OPTICS, FINE MECHANICS AND PHYSICS, CHINESE ACADEMY OF SCIENCES, Changchun (CN)

( * ) Notice: Subject to any disclaimer, the term of this patent is extended or adjusted under 35 U.S.C. 154(b) by 0 days.

(21) Appl. No.: 18/812,069

(22) Filed: Aug. 22, 2024

(65) Prior Publication Data
US 2025/0068123 A1    Feb. 27, 2025

(30) Foreign Application Priority Data

Aug. 22, 2023   (CN) .......................... 202311055791.3

(51) Int. Cl.
G03H 1/04   (2006.01)
G03H 1/00   (2006.01)

(52) U.S. Cl.
CPC ......... G03H 1/0486 (2013.01); G03H 1/0005 (2013.01); *G03H 2001/0094* (2013.01)

(58) Field of Classification Search
CPC ............ G02B 6/02138; G02B 27/0172; G02B 5/1847; G02B 5/1857; G02B 27/0025;
(Continued)

(56) References Cited

U.S. PATENT DOCUMENTS

| 6,882,477 B1 * | 4/2005 | Schattenburg ...... G03F 7/70408 359/35 |
| 2004/0005116 A1 * | 1/2004 | Sweetser ................ G02B 6/124 385/37 |

(Continued)

FOREIGN PATENT DOCUMENTS

| CN | 104237987 A | 12/2014 |
| CN | 104570621 A | 4/2015 |

(Continued)

OTHER PUBLICATIONS

Machine translation of CN-105954977-A (Year: 2016).*
(Continued)

*Primary Examiner* — Pinping Sun
*Assistant Examiner* — Matthew Y Lee
(74) *Attorney, Agent, or Firm* — HOWARD M COHN and Associates, LLC

(57) ABSTRACT

A method and a device for compensating a surface error of a holographic grating substrate based on scanning and exposure technology relates to a technical field of grating development. The method and the device adopt surface error compensation technology based on phase modulation of interference fringes of a scanning beam interference lithography system. The method and the device solve a poor grating diffraction wavefront quality caused by a surface processing error in a field of holographic grating research and improves full-aperture diffraction wavefront quality of a grating. Through coordination between feedback of the displacement measurement apparatus for the position of the
(Continued)

two-dimensional worktop and the modulation of the scanning beam interference lithography system, full-aperture compensation of the surface error of the holographic grating substrate is achieved, which not only reduces processing accuracy requirements for the holographic grating substrate, but also improves the full-aperture diffraction wavefront quality of the grating.

3 Claims, 4 Drawing Sheets

(58) Field of Classification Search
CPC . G03F 7/70775; G03F 7/70408; G03H 1/202; G03H 1/00; G03H 1/0005; G03H 1/0248; G03H 1/0276; G03H 1/0408; G03H 1/0465; G03H 1/0486; G03H 1/20; G03H 1/2294; G03H 1/26; G03H 2001/026; G03H 2001/0439; G03H 2001/0482; G03H 2001/205; G03H 2001/2226; G03H 2222/36; G03H 2223/16; G03H 2223/24; G03H 2225/21; G03H 2225/32; G03H 2260/00; G03H 2001/0094; G03H 2001/0491
See application file for complete search history.

(56) References Cited

U.S. PATENT DOCUMENTS

| | | | | |
|---|---|---|---|---|
| 2009/0027640 | A1* | 1/2009 | Shibazaki | G03F 7/70775 356/450 |
| 2009/0257039 | A1* | 10/2009 | Kishikawa | G03B 27/72 355/71 |
| 2015/0378306 | A1* | 12/2015 | Gurevich | G03H 1/0005 359/12 |
| 2018/0284619 | A1* | 10/2018 | Shirato | G03F 7/2057 |
| 2022/0228890 | A1* | 7/2022 | Li | G01B 11/02 |
| 2024/0061352 | A1* | 2/2024 | Wang | G03F 7/2006 |

FOREIGN PATENT DOCUMENTS

| | | | | | |
|---|---|---|---|---|---|
| CN | 105954977 | A | * | 9/2016 | G02B 5/1857 |
| CN | 107607060 | A | | 1/2018 | |
| CN | 112255717 | A | * | 1/2021 | G02B 5/1852 |
| CN | 112255722 | A | | 1/2021 | |

OTHER PUBLICATIONS

Machine translation of CN-112255717-A (Year: 2021).*
Notification to Grant Patent Right for Invention, Chinese Application No. 202311055791.3, mailed Oct. 23, 2023 (3 pages).
CNIPA, Office Action issued for Chinese Application No. 202311055791.3, mailed Sep. 19, 2023 (12 pages).
Chao Yang et al., "Reducing machine-ruling grating wavefront value by compensating grating substrate surface error in real time", «Optics Communications», full text, Issued Date Mar. 8, 2018.
Zhaowu Liu et al., "Study on wavefront control of grating diffraction on Scanning Beam Interference Lithography System", Chinese doctoral dissertation full text database Basic Science series, Text pags 83-105, Issued Date Aug. 15, 2017.
Chao Yang et al., "Research on correcting of the grating groove error in large area and real-time montoring technology", Chinese doctoral dissertation full text database Engineering Science and Technology II series, Text pags 83-105, Issued Date Oct. 15, 2015.

* cited by examiner

METHOD AND DEVICE FOR COMPENSATING SURFACE ERROR OF HOLOGRAPHIC GRATING SUBSTRATE

TECHNICAL FIELD

The present disclosure relates to a technical field of grating development, and in particular to a method and a device for compensating a surface error of a holographic grating substrate based on scanning and exposure technology.

BACKGROUND

Diffraction wavefront quality is one of the important performance indicators of gratings. High diffraction wavefront quality enables the gratings to have extremely high resolution and imaging characteristics. Therefore, the gratings are widely used in high-precision equipment such as astronomical telescopes, spectrometers, and high-energy laser systems. Grating diffraction wavefront errors mainly consist of two parts, which are substrate surface error and ruled line errors. Difficulty of processing grating substrates increases with sizes of the grating substrates. In addition, regardless of the sizes of the grating substrates, it is impossible to achieve near-ideal processing accuracy, resulting in the substrate surface error. For small-sized gratings, it is easy to achieve high surface accuracy, but for large-sized grating substrates, when requirements for the diffraction wavefront quality are extremely high, there are significant challenges such as high processing difficulty, long duration, high cost, and limited surface accuracy in a surface of the large-sized grating substrates surface, making it difficult to ensure extremely low surface error over meter-scale dimensions. Therefore, in order to obtain a near-ideal diffraction wavefront, under a condition of known substrate surface error, the diffraction wavefront is modulated by controlling the ruled line errors to achieve an effect of compensating for the surface error of the grating substrates.

There are two technical solutions in the prior art. In a first technical solution thereof, CHAO YANG proposed a method for compensating surface error of a grating substrate based on a mechanical engraving machine by using a substrate support and by grooving on the grating substrate. First, optimal positions of four support seats under a loading base of the grating substrate are optimized through simulation of a finite element software to minimize a surface change of the loading base of the grating substrate. Then, a grating groove active control technology is applied to compensate for the surface error of the grating substrate by changing a swing angle between a diamond engraving knife and a surface of the grating substrate. CHAO YANG conducted a grating diffraction wavefront compensation experiment, and it turns out that a peak-valley (PV) value of a +36th order diffraction wavefront of a medium-step grating dropped from 0.076λ to 0.056λ, verifying the feasibility of compensating for the surface error in the engraved grating. A second technical solution thereof is to reduce the surface error in active control of the grating diffraction wavefront. ZHAOWU LIU proposed an active wavefront control technology based on a scanning beam interference lithography system. A sinusoidal target wavefront is simulated and predetermined. By controlling a phase distribution in an X direction and conducting exposure and development experiments, a grating mask with a sinusoidal wavefront consistent with the sinusoidal target wavefront is obtained.

However, the prior art has some defects. First, in a field of ruled grating research and development, online correction of a curvature of a ruled line is limited by a working mode of a grating ruling machine itself. A compensation amount of the surface error obtained by correcting the curvature of a single ruled line is extremely small, which is unable to compensate for larger surface error and does not belong to a technical field of holographic grating research and development. Second, in terms of wavefront modulation, the prior art only achieves phase modulation in the X direction (i.e., a stepping direction) and does not achieve the phase modulation in a Y direction (i.e., a scanning direction). The prior art fundamentally does not have a full-aperture compensation function for the surface errors of a holographic grating substrate.

SUMMARY

To solve problems in the prior art, the present disclosure provides a method and a device for compensating a surface error of a holographic grating substrate based on scanning and exposure technology.

In a first aspect, the present disclosure provides the method for compensating the surface error of the holographic grating substrate based on the scanning and exposure technology. The method comprises steps:
  obtaining a surface error distribution diagram corresponding to the holographic grating substrate by detecting the surface error of the holographic grating substrate;
  obtaining a phase distribution of predetermined phases compensating for the surface error through simulation calculation; and
  decomposing the phase distribution of the predetermined phases into a first coordinate matrix corresponding to phases of the holographic grating substrate in a point-to-point manner, exposing coordinate points of the predetermined phases, different with the phases of the holographic grating substrate, in the first coordinate matrix on photoresist disposed on a surface of the holographic grating substrate by stepping, scanning, and exposure, and developing to obtain a grating mask.

In one optional embodiment, after the step of obtaining the phase distribution of the predetermined phases compensating for the surface error through simulation calculation, the method further comprises a step of pre-compensating phases of the surface error by using a scanning interference field exposure model, and forming a compensation table by pre-compensated phase values of the phases of the surface error.

In one optional embodiment, the step of decomposing the phase distribution of the predetermined phases into the first coordinate matrix corresponding to phases of the holographic grating substrate in the point-to-point manner, exposing the coordinate points of the predetermined phases, different with the phases of the holographic grating substrate, in the first coordinate matrix on photoresist disposed on the surface of the holographic grating substrate by stepping, scanning, and exposure, and developing to obtain the grating mask comprises:
  accurately positioning the holographic grating substrate of a predetermined size from an exposure start point to an exposure end point by a displacement measurement apparatus to obtain a second coordinate matrix of the holographic grating substrate; and
  corresponding the predetermined phases for compensating the surface error of the holographic grating substrate one-to-one to the coordinate points in the second coordinate matrix of the holographic grating substrate, feeding back a position of the holographic grating substrate by the displacement measurement apparatus in real time, and scanning and exposing the photoresist on the surface of the holographic grating substrate by a scanning beam interference lithography system, and then developing the photoresist to obtain the grating mask after surface compensation modulation.

In one optional embodiment, a phase modulation principle of the scanning beam interference lithography system is as follow.

First, spatially filtered and collimated small-size Gaussian beams emitted by the scanning beam interference lithography system are interfered at beam waist positions thereof to form interference fringes. A phase of the interference fringes at a position (x,y) at time t is $\phi_{ph}(x,y,t)$, a total exposure after scanning and exposure is:

$$D(x, y) = A(x, y)\left\{1 + \gamma\cos\left[\frac{2\pi}{p}x + \Phi_{ph(x,y)}\right]\right\}.$$

$$\frac{2\pi}{p} + \Phi_{ph}(x, y)$$

is an exposure phase distribution after stepping, scanning, and exposure, and $\Phi_{ph\ (x,y)}$ is a predetermined phase distribution related to $\emptyset_{ph\ (x,y,t)}$, and a value of $\emptyset_{ph\ (x,y,t)}$ is changed to obtain the predetermined phase distribution $\Phi_{ph\ (x,y)}$ of the surface of the holographic grating substrate.

Then, detecting the surface error of the holographic grating substrate, and obtaining the phase distribution of the predetermined phases compensating for the surface error through simulation calculation:

$$\Phi_{ph,e}(x, y) = \begin{bmatrix} \phi_{(x_1,y_1)} & \cdots & \phi_{(x_m,y_1)} \\ \cdots & \cdots & \cdots \\ \phi_{(x_1,y_n)} & \cdots & \phi_{(x_m,y_n)} \end{bmatrix}.$$

Measuring a displacement of a two-dimensional worktop by a displacement measurement apparatus and obtaining the second coordinate matrix H of the holographic grating substrate:

$$H = \begin{bmatrix} x_1, y_1 & \cdots & x_m, y_1 \\ \cdots & \cdots & \cdots \\ x_1, y_n & \cdots & x_m, y_n \end{bmatrix}.$$

During a scanning and stepping process of the two-dimensional worktop, when not modulated, there is a phase distribution W of the holographic grating substrate one-to-one corresponding to coordinate points in the second coordinate matrix H; the phase distribution W is represented by:

$$W = \begin{bmatrix} \phi_{(x_1,y_1)} & \cdots & \phi_{(x_m,y_1)} \\ \cdots & \cdots & \cdots \\ \phi_{(x_1,y_n)} & \cdots & \phi_{(x_m,y_n)} \end{bmatrix}.$$

φ is a phase modulation term and is a feedback of a phase control apparatus through a displacement measurement of the two-dimensional worktop. Phases of the interference fringes are directionally modulated by changing frequencies of phase modulators, φ is expressed as:

$$\varphi = \begin{bmatrix} \delta_{\varphi(1,1)} & \cdots & \delta_{\varphi(m,1)} \\ \cdots & \cdots & \cdots \\ \delta_{\varphi(1,n)} & \cdots & \delta_{\varphi(m,n)} \end{bmatrix}.$$

After phase modulation, a phase distribution $W_n$ of modulated phases one-to-one corresponding to the coordinate points in the second coordinate matrix is represented by:

$$W_n = \begin{bmatrix} \phi_{(x_1,y_1)} + \delta_{\varphi(1,1)} & \cdots & \phi_{(x_m,y_1)} + \delta_{\varphi(m,1)} \\ \cdots & \cdots & \cdots \\ \phi_{(x_1,y_n)} + \delta_{\varphi(1,n)} & \cdots & \phi_{(x_m,y_n)} + \delta_{\varphi(m,n)} \end{bmatrix} = \Phi_{ph,e}(x, y).$$

The phase distribution $W_n$ of the modulated phases is same as the phase distribution $\Phi_{ph,e}(x,y)$ of the predetermined phases.

In a second aspect, the present disclosure provides the device for compensating the surface error of the holographic grating substrate based on the scanning and exposure technology. The device has scan and exposure functions and is applied to the method mentioned above. The device comprises a first reflector, a second reflector, a third reflector, a fourth reflector, a first phase modulator, a second phase modulator, a first beam splitter, a second beam splitter, a third beam splitter, a two-dimensional worktop, a reference mirror, a displacement detection apparatus, a phase detector, and a master controller.

A left exposure beam is reflected by the first reflector and the fourth reflector in sequence, passes through the first phase modulator, and passes through the first beam splitter to be divided into a first light beam and a second light beam. The first light beam is interfered and then enters the phase detector through the third beam splitter, and the second light beam in the left exposure beam is incident on the holographic grating substrate to form first interference fringes for exposure.

A right exposure beam is reflected by the third reflector and the fourth reflector in sequence, passes through the second phase modulator, and passes through the second beam splitter to be divided into a third light beam and a fourth light beam. The third light beam is interfered and then enters the phase detector through the third beam splitter, and the fourth light beam is incident on the holographic grating substrate to form second interference fringes for exposure. The first interference fringes and the second interference fringes jointly form the interference fringes.

When the holographic grating substrate and the two-dimensional worktop move, the reference mirror and the displacement measurement apparatus position the two-dimensional worktop and detect the displacement of the two-dimensional worktop in real time. The master controller controls the first phase modulator and the second phase modulator to modulate phases of the first interference fringes and phases of the second interference fringes when the two-dimensional worktop performs stepping scanning motion to any point, so that phases of modulated interference fringes meets the phase distribution of the predetermined phases of the interference fringes.

Compared with the prior art, the present disclosure adopts the interference fringes from the scanning beam interference lithography system to modulate phases of the holographic grating substrate, thereby compensating for the surface error of the holographic grating substrate, solving the surface error of the holographic grating substrate due to processing accuracy limitations in the field of holographic grating research and development, and improving full-aperture diffraction wavefront quality of a grating. Through coordination between feedback of the displacement measurement apparatus for the position of the two-dimensional worktop and the modulation of the scanning beam interference lithography system, full-aperture compensation of the surface error of the holographic grating substrate is achieved, which not only reduces processing accuracy requirements for the holographic grating substrate, but also improves the full-aperture diffraction wavefront quality of the grating. Moreover, the present disclosure is conducive to shortening a processing period of a meter-level grating substrate and reducing costs.

Figure 1:
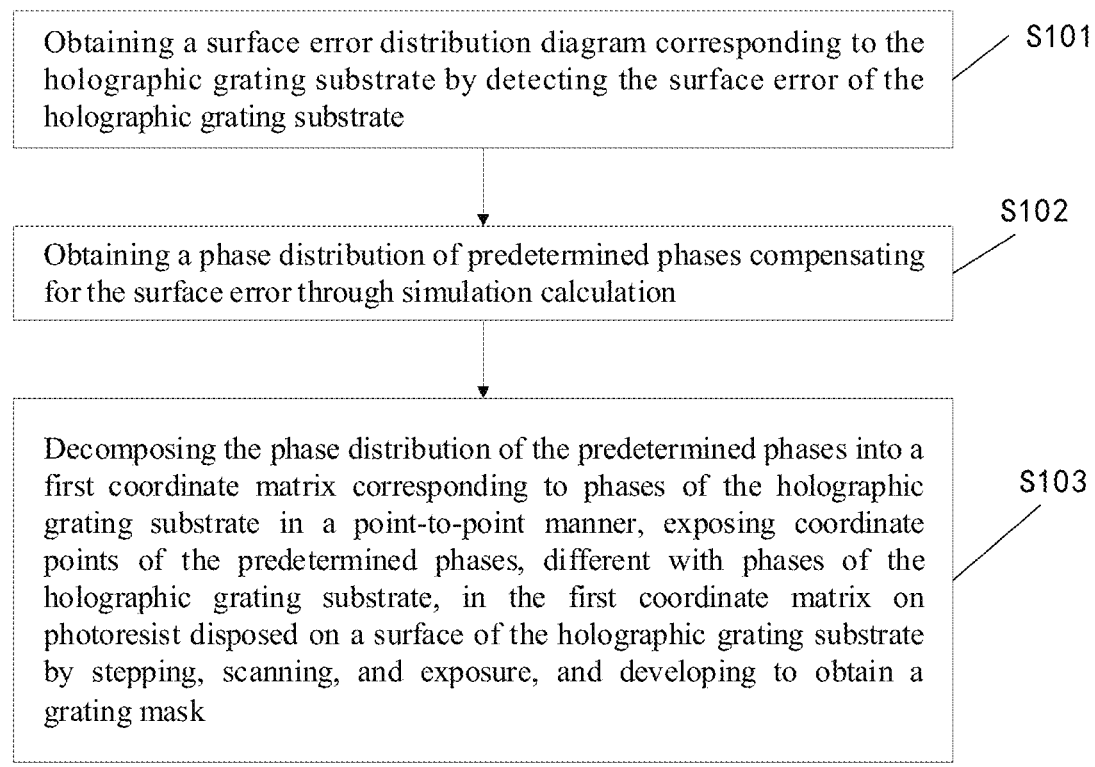
FIG. 1 is a flow chart of a method for compensating surface error of a holographic grating substrate based on scanning and exposure technology according to one embodiment of the present disclosure.

Reference numbers in the drawings: right exposure beam 1; left exposure beam 2; first reflector 3; second reflector 4; third reflector 5; fourth reflector 6; first phase modulator 7; second phase modulator 8; first beam splitter 9; second beam splitter 10; holographic grating substrate 11; two-dimensional worktop 12; air bearing table 13; reference mirror 14; displacement detection apparatus 15; third beam splitter 16; phase detector 17; and master controller 18.

DETAILED DESCRIPTION

Embodiments of the present disclosure are described with reference to the accompanying drawings as follow. In the following description, same modules are denoted by same reference numerals. In the case of the same reference numerals, their names and functions are the same. Therefore, the detailed description thereof is not repeated.

In order to make objectives, technical solutions, and advantages of the present disclosure clearer, the following further describes the present disclosure in detail with reference to accompanying drawings and embodiments. It should be understood that the specific embodiments described here are only used to explain the present disclosure, but not to limit the present disclosure.

As shown in FIG. 1, the present disclosure provides a method for compensating surface error of a holographic grating substrate 11 based on scanning and exposure technology. The method comprises steps S101-S103.

The step S101 comprises obtaining a surface error distribution diagram corresponding to the holographic grating substrate 11 by detecting the surface error of the holographic grating substrate 11.

The step S102 comprises obtaining a phase distribution of predetermined phases compensating for the surface error through simulation calculation.

The step S103 comprises decomposing the phase distribution of the predetermined phases into a first coordinate matrix corresponding to phases of the holographic grating substrate 11 in a point-to-point manner, exposing coordinate points of the predetermined phases, different with the phases of the holographic grating substrate 11, in the first coordinate matrix on photoresist disposed on a surface of the holographic grating substrate 11 by stepping, scanning, and exposure, and developing to obtain a grating mask.

In one optional embodiment, the surface error of the holographic grating substrate 11 is detected by an interferometer to obtain a wavefront map (i.e., the surface error distribution diagram) corresponding to the surface error of the holographic grating substrate 11. The phase distribution of predetermined phases compensating for the surface error is obtained through simulation calculation. Phases of the surface error are pre-compensated by using a scanning interference field exposure model. A compensation table is formed by pre-compensated phase values of the phases of the surface error. The compensation table is input into a phase control apparatus. The surface error is compensated from an exposure start point to an exposure end point. The surface error is compensated point by point according to the compensation table, and finally an overall diffraction wavefront that is close to an ideal diffraction wavefront is obtained.

Specifically, the holographic grating substrate 11 of a predetermined size is accurately positioned from the exposure start point to the exposure end point by a displacement measurement apparatus for a two-dimensional worktop 12 to obtain a second coordinate matrix of the holographic grating substrate 11. Then, the predetermined phases of the surface error of the holographic grating substrate 11 is one-to-one corresponding to coordinate points in the second coordinate matrix of the holographic grating substrate 11. A position of the holographic grating substrate 11 is feedback by the displacement measurement apparatus in real time, and the photoresist on the surface of the holographic grating substrate 11 is scanned, exposed, and developed to obtain the grating mask after surface compensation modulation. It should be noted that the detection of the surface error of the holographic grating substrate 11 is not limited to be performed by the interferometer, and those skilled in the art can flexibly choose other equipment, which is not limited thereto.

The present disclosure adopts the interference fringes from the scanning beam interference lithography system to modulate the phases of the holographic grating substrate 11, thereby compensating for the surface error of the holographic grating substrate 11, solving the surface error of the holographic grating substrate 11 due to processing accuracy limitations in the field of holographic grating research and development, and improving full-aperture diffraction wavefront quality of a grating. Through coordination between feedback of the displacement measurement apparatus for the position of the two-dimensional worktop and the modulation of the scanning beam interference lithography system, full-aperture compensation of the surface error of the holographic grating substrate 11 is achieved, which not only reduces processing accuracy requirements for the holographic grating substrate 11, but also improves the full-aperture diffraction wavefront quality of the grating. Moreover, the present disclosure is conducive to shortening a processing period of a meter-level grating substrate and reducing costs.

In one optional embodiment, after the step of obtaining the phase distribution of the predetermined phases compensating for the surface error through simulation calculation, the method further comprises a step of pre-compensating phases of the surface error by using a scanning interference field exposure model, and forming a compensation table by pre-compensated phase values of the phases of the surface error.

In one optional embodiment, the step of decomposing the phase distribution of the predetermined phases into the first coordinate matrix corresponding to phases of the holographic grating substrate in the point-to-point manner, exposing the coordinate points of the predetermined phases, different with the phases of the holographic grating substrate, in the first coordinate matrix on photoresist disposed on the surface of the holographic grating substrate by stepping, scanning, and exposure, and developing to obtain the grating mask comprises:

accurately positioning the holographic grating substrate of a predetermined size from an exposure start point to an exposure end point by a displacement measurement apparatus to obtain a second coordinate matrix of the holographic grating substrate; and corresponding the predetermined phases for compensating the surface error of the holographic grating substrate one-to-one to the coordinate points in the second coordinate matrix of the holographic grating substrate, feeding back a position of the holographic grating substrate by the displacement measurement apparatus in real time, and scanning and exposing the photoresist on the surface of the holographic grating substrate by a scanning beam interference lithography system, and then developing the photoresist to obtain the grating mask after surface compensation modulation.

In one optional embodiment, a phase modulation principle of the scanning beam interference lithography system is as follow.

First, spatially filtered and collimated small-size Gaussian beams emitted by the scanning beam interference lithography system are interfered at beam waist positions thereof to form interference fringes. A phase of the interference fringes at a position (x,y) at time t is $\phi_{ph}(x,y,t)$, a total exposure after scanning and exposure is:

$$D(x, y) = A(x, y)\left\{1 + \gamma\cos\left[\frac{2\pi}{p}x + \Phi_{ph(x,y)}\right]\right\}.$$

The spatially filtered and collimated small-size Gaussian beams comprises a left exposure beam and a right exposure beam. An energy distribution of the left exposure beam is consistent with an energy distribution of the right exposure beam.

$$\frac{2\pi}{p} + \Phi_{ph}(x, y)$$

is an exposure phase distribution after stepping, scanning, and exposure, and $\Phi_{ph\ (x,y)}$ is a predetermined phase distribution related to $\emptyset_{ph\ (x,y,t)}$, and a value of $\emptyset_{ph\ (x,y,t)}$ is changed to obtain the predetermined phase distribution $\Phi_{ph\ (x,y)}$ of the surface of the holographic grating substrate. A(x,y) represents energy of the left exposure beam and the right exposure beam. A(x,y) is expresses as follow:

$$A(x, y) = A\omega_y\sqrt{\frac{\pi}{2}}\exp\left\{-2\frac{[x-(n-1)S]^2}{\omega_X^2}\right\}.$$

Then, detecting the surface error of the holographic grating substrate, and obtaining the phase distribution of the predetermined phases compensating for the surface error through simulation calculation:

$$\Phi_{ph,e}(x, y) = \begin{bmatrix} \phi_{(x_1,y_1)} & \cdots & \phi_{(x_m,y_1)} \\ \cdots & \cdots & \cdots \\ \phi_{(x_1,y_n)} & \cdots & \phi_{(x_m,y_n)} \end{bmatrix}.$$

Measuring a displacement of a two-dimensional worktop by a displacement measurement apparatus and obtaining the second coordinate matrix H of the holographic grating substrate:

$$H = \begin{bmatrix} x_1, y_1 & \cdots & x_m, y_1 \\ \cdots & \cdots & \cdots \\ x_1, y_n & \cdots & x_m, y_n \end{bmatrix}.$$

During a scanning and stepping process of the two-dimensional worktop, when not modulated, there is a phase distribution W of the holographic grating substrate one-to-one corresponding to coordinate points in the second coordinate matrix H. The phase distribution W is represented by:

$$W = \begin{bmatrix} \phi_{(x_1,y_1)} & \cdots & \phi_{(x_m,y_1)} \\ \cdots & \cdots & \cdots \\ \phi_{(x_1,y_n)} & \cdots & \phi_{(x_m,y_n)} \end{bmatrix}.$$

φ is a phase modulation term and is a feedback of a phase control apparatus through a displacement measurement of the two-dimensional worktop. Phases of the interference fringes are directionally modulated by changing frequencies of phase modulators. φ is expressed as:

$$\varphi = \begin{bmatrix} \delta_{\varphi(1,1)} & \cdots & \delta_{\varphi(m,1)} \\ \cdots & \cdots & \cdots \\ \delta_{\varphi(1,n)} & \cdots & \delta_{\varphi(m,n)} \end{bmatrix}.$$

After phase modulation, a phase distribution $W_n$ of modulated phases one-to-one corresponding to the coordinate points in the second coordinate matrix is represented by:

$$W_n = \begin{bmatrix} \phi_{(x_1,y_1)} + \delta_{\varphi(1,1)} & \cdots & \phi_{(x_m,y_1)} + \delta_{\varphi(m,1)} \\ \cdots & \cdots & \cdots \\ \phi_{(x_1,y_n)} + \delta_{\varphi(1,n)} & \cdots & \phi_{(x_m,y_n)} + \delta_{\varphi(m,n)} \end{bmatrix} = \Phi_{ph,e}(x, y).$$

The phase distribution $W_n$ of the modulated phases is same as the phase distribution $\Phi_{ph,e}(x,y)$ of the predetermined phases. Thereby, purposes of compensating the surface error of the holographic grating substrate 11 and improving the diffraction wavefront quality are achieved through the point-to-point modulation method of scanning interference field exposure.

Figure 2:
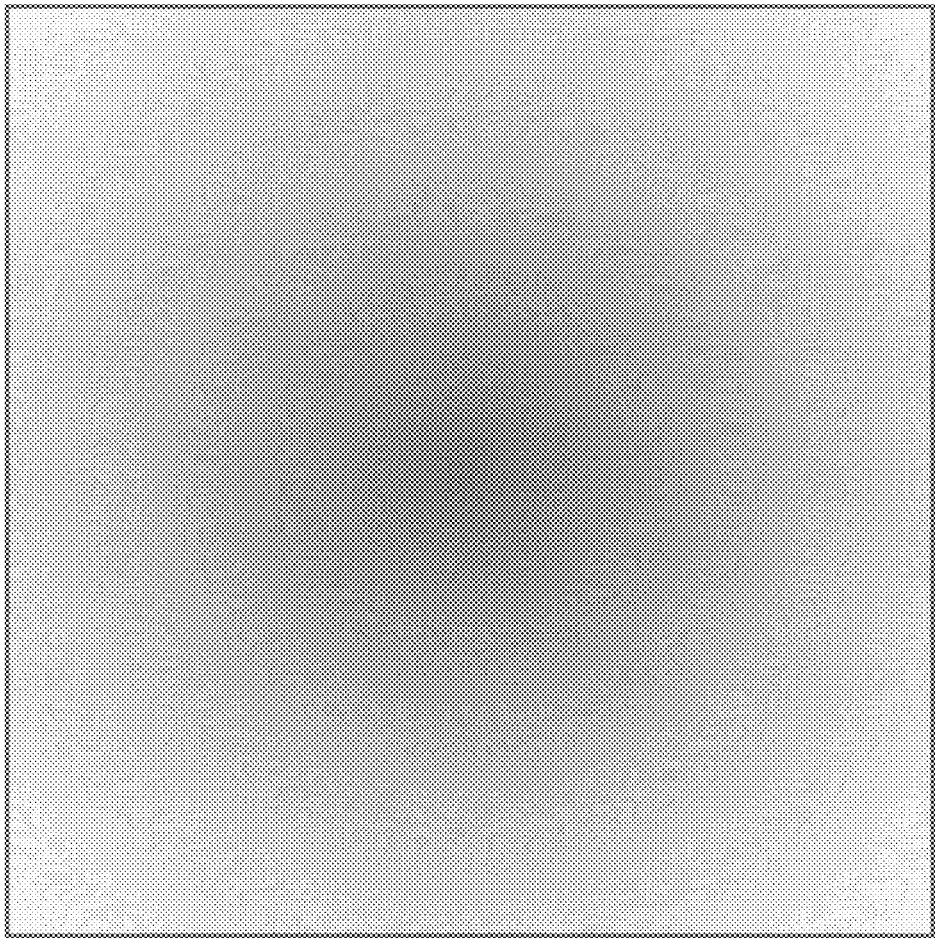
FIG. 2 is a schematic diagram of the surface error of the method according to one embodiment of the present disclosure.
Figure 3:
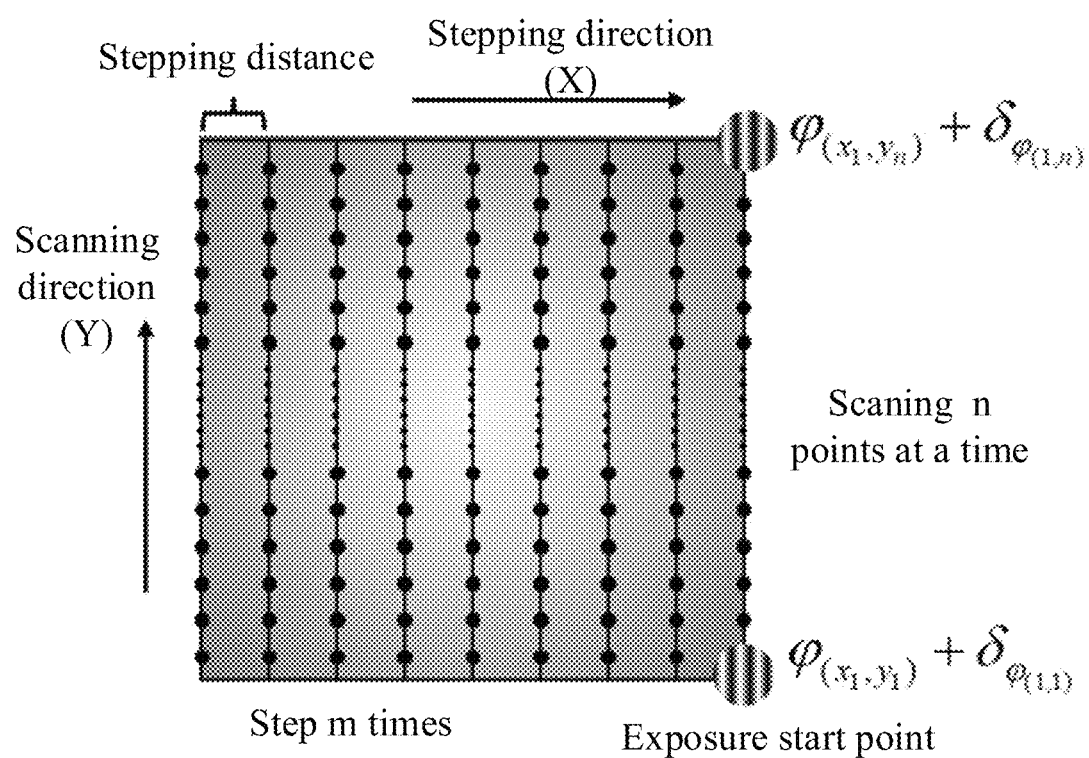
FIG. 3 is a schematic diagram showing the holographic grating substrate is process by stepping, scanning, and exposure according to one embodiment of the present disclosure.

Specifically, when the surface error of the holographic grating substrate 11 is detected by the interferometer, a surface error distribution diagram as shown in FIG. 2 is obtained The phase distribution of predetermined phases compensating for the surface error is obtained through simulation calculation. As shown in FIG. 3, the phase distribution of the predetermined phases is decomposed into the first coordinate matrix of m×n corresponding to the second coordinate matrix of the holographic grating substrate in the point-to-point manner. The scanning beam interference lithography system performs step-scanning exposure, and coordinate points of the the phases of the second coordinate matrix that are different with the coordinate points of the predetermined phases in the first coordinate matrix are modulated to be same as the predetermined phases and are respectively recorded on the photoresist on the surface of the holographic grating substrate 11, and finally the grating mask is obtained.

The method for compensating the surface error of the holographic grating substrate 11 based on the scanning and exposure technology of the present disclosure is shown to be practical and effective through simulation and experiment. Specifically, the surface error of the holographic grating substrate 11 is PV=3.244λ, and 85 mm×85 mm grating mask exposure experiment of a +1-order diffraction wavefront error PV=2.573λ is carried out to measure the surface error. The phase distribution of the interference fringes for compensating the surface error is calculated. During an exposure process, dynamic phase locking technology is adopted to reflect the predetermined phases in the diffraction wavefront of the grating mask An actual diffraction wavefront of the grating mask is measured to be PV=0.399λ, which greatly reduces a PV value of the surface error of the holographic grating substrate 11.

The method for compensating the surface error of the holographic grating substrate 11 based on the scanning and exposure technology of the present disclosure is used to solve a problem of a surface processing error of the holographic grating substrate 11 that cannot be eliminated. In the scanning, splicing, and exposure process, an error caused by the surface error of the holographic grating substrate 11 to the diffraction wavefront is compensated by the phase modulation of the interference fringes. In the field of holographic gratings, the method based on the scanning and exposure technology effectively improves the diffraction wavefront quality of the holographic grating substrate 11, such as a full-aperture grating substrate 11, while reducing processing accuracy requirements of the holographic gratings of various sizes, improving processing efficiency of the holographic grating substrate 11, and shortening a circle of grating development.

Figure 4:
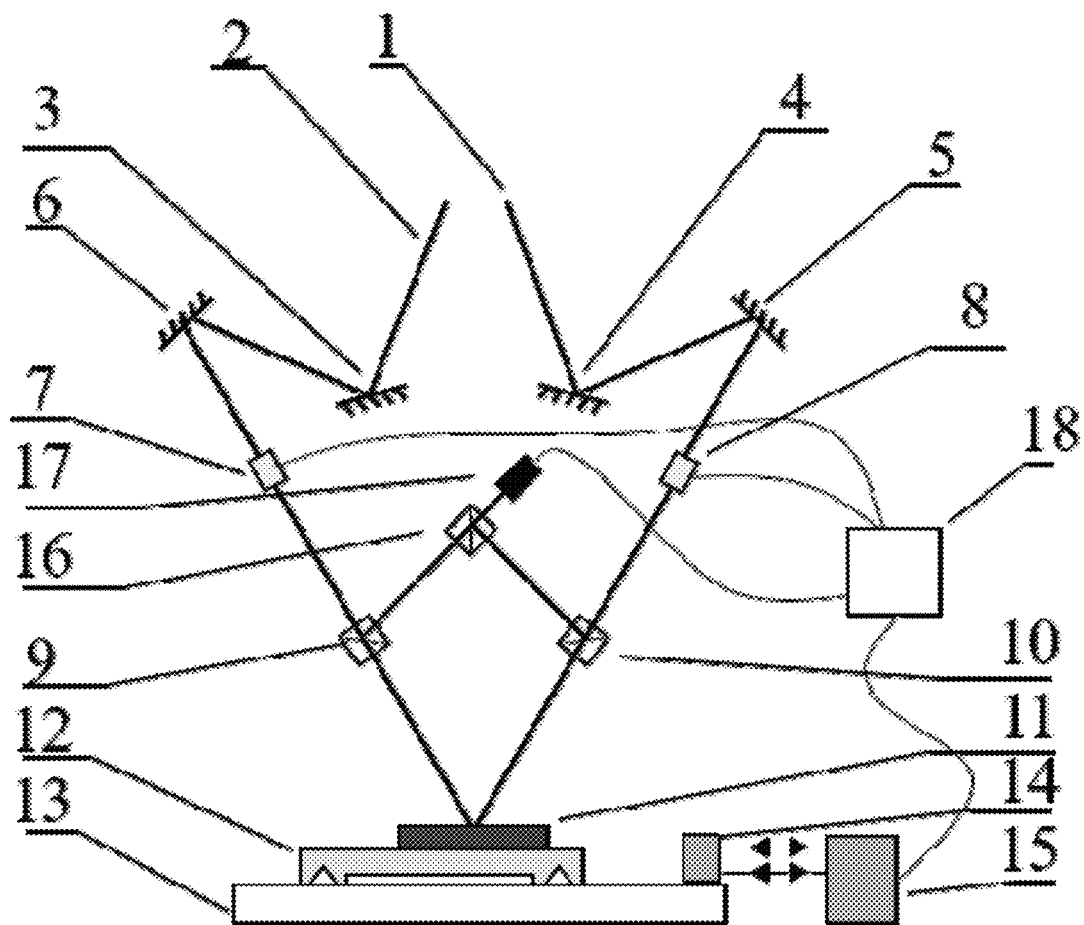
FIG. 4 is a schematic diagram of a device for compensating surface error of the holographic grating substrate based on the scanning and exposure technology according to one embodiment of the present disclosure.

As shown in FIG. 4, the present disclosure provides a device for compensating the surface shape error of the holographic grating substrate 11 based on the scanning and exposure technology. The device has scan and exposure functions and is applied to the method mentioned above. The device comprises a first reflector 3, a second reflector 4, a third reflector 5, a fourth reflector 6, a first phase modulator 7, a second phase modulator 8, a first beam splitter 9, a second beam splitter 10, a third beam splitter 16, a two-dimensional worktop 12, a reference mirror 14, a displacement detection apparatus 15, a phase detector 17, and a master controller 18. The two-dimensional worktop 12 is disposed on an air bearing table 13, which further reduce an influence of vibration generated during operation on positioning of the displacement detection apparatus 15.

A left exposure beam 2 is reflected by the first reflector 3 and the fourth reflector 6 in sequence, passes through the first phase modulator 7, and passes through the first beam splitter 9 to be divided into a first light beam and a second light beam. The first light beam is interfered and then enters the phase detector 17 through the third beam splitter 16. The phase detector 17 performs real-time phase monitoring and dynamic phase locking on the first light beam by heterodyne measurement or homodyne measurement. The second light beam is incident on the holographic grating substrate 11 to form first interference fringes for exposure.

A right exposure beam 1 is reflected by the third reflector 5 and the fourth reflector 6 in sequence, passes through the second phase modulator 8, and passes through the second beam splitter 10 to be divided into a third light beam and a fourth light beam. The third light beam is interfered and then enters the phase detector 17 through the third beam splitter 16. The phase detector 17 performs real-time phase monitoring and dynamic phase locking on the third light beam by heterodyne measurement or homodyne measurement. The fourth light beam is incident on the holographic grating substrate 11 to form second interference fringes for exposure.

When the holographic grating substrate 11 and the two-dimensional worktop 12 move, the reference mirror 14 and the displacement measurement apparatus 15 position the two-dimensional worktop 12 and detect the displacement of the two-dimensional worktop 12 in real time. The master controller 18 controls the first phase modulator 7 to modulate phases of the first interference fringe and the second phase modulator 8 to modulate phases of the second interference fringes, when the two-dimensional worktop 12 performs stepping scanning motion to any coordinate point, so that phases of modulated interference fringes on the holographic grating substrate 11 meets the phase distribution of the predetermined phases of the interference fringes.

In the device for compensating the surface shape error of the holographic grating substrate 11 based on the scanning and exposure technology of the present disclosure, the holographic grating substrate 11 of the predetermined size is accurately positioned from the exposure start point to the exposure end point by the displacement measurement apparatus 15 for the two-dimensional worktop 12 to obtain the second coordinate matrix of the holographic grating substrate 11. Then, the predetermined phases for compensating the surface error are one-to-one corresponding to the coordinate points in the second coordinate matrix of the holographic grating substrate 11, the position of the holographic grating substrate 11 is feedback by the displacement measurement apparatus 15 in real time. After scanning and exposing the photoresist on the surface of the holographic grating substrate 11, the grating mask after surface compensation modulation is obtained, solving the surface error of the holographic grating substrate 11 due to processing accuracy limitations in the field of holographic grating research and development, and improving full-aperture diffraction wavefront quality of the grating. Through coordination between feedback of the displacement measurement apparatus for the position of the two-dimensional worktop and the modulation of the scanning beam interference lithography system, full-aperture compensation of the surface error of the holographic grating substrate 11 is achieved, which not only reduces processing accuracy requirements for the holographic grating substrate 11, but also improves the full-aperture diffraction wavefront quality of the grating.

It should be understood that various forms of the processes shown above may be reorder and the steps may be added or removed. For example, the steps described in the present disclosure may be performed at the same time, sequentially, or in a different order, as long as a desired result of technical solutions disclosed in the present disclosure can be implemented, which is not limited herein.

The above specific embodiments do not constitute a limitation on the protection scope of the present disclosure.

Those skilled in the art should understand that various modifications, combinations, sub-combinations and substitutions may be made according to design requirements and other factors. Any modification, equivalent replacement and improvement made within the spirit and principle of the present disclosure shall be included in the protection scope of the present disclosure.

What is claimed is:

1. A method for compensating a surface error of a holographic grating substrate, comprising steps:
obtaining a surface error distribution diagram corresponding to the holographic grating substrate by detecting the surface error of the holographic grating substrate;
obtaining a phase distribution of predetermined phases compensating for the surface error through simulation calculation; and
decomposing the phase distribution of the predetermined phases into a first coordinate matrix corresponding to phases of the holographic grating substrate in a point-to-point manner, exposing coordinate points of the predetermined phases, different from the phases of the holographic grating substrate, in the first coordinate matrix on photoresist disposed on a surface of the holographic grating substrate by stepping, scanning, and exposure, and developing to obtain a grating mask;
wherein a phase modulation principle of a scanning beam interference lithography system comprises:
interfering at beam waist positions of spatially filtered and collimated small-size Gaussian beams emitted by the scanning beam interference lithography system to form interference fringes; a phase of the interference fringes at a position (x,y) at time t is $\phi_{ph}(x,y,t)$, a total exposure after scanning and exposure is:

$$D(x,y)=A(x,y)\{1+\gamma \cos[2\pi/px+\Phi_{ph(x,y)}]\},$$

wherein $2\pi/px+\varnothing_{ph\ (x,y)}$ is an exposure phase distribution after stepping, scanning, and exposure, and $\Phi_{ph\ (x,y)}$ is a phase distribution related to $\varnothing_{ph\ (x,y,t)}$, and a value of $\varnothing_{ph\ (x,y,t)}$ is changed to obtain a predetermined phase distribution $\Phi_{ph\ (x,y)}$ of the surface of the holographic grating substrate;
detecting the surface error of the holographic grating substrate, and obtaining the phase distribution $\Phi_{ph,e}(x, y)$ of the predetermined phases compensating for the surface error through the simulation calculation:

$$\Phi_{ph,e}(x,y) = \begin{bmatrix} \phi_{(x_1,y_1)} & \cdots & \phi_{(x_m,y_1)} \\ \cdots & \cdots & \cdots \\ \phi_{(x_1,y_n)} & \cdots & \phi_{(x_m,y_n)} \end{bmatrix};$$

measuring a displacement of a two-dimensional worktop by a displacement measurement apparatus and obtaining a second coordinate matrix H of the holographic grating substrate:

$$H = \begin{bmatrix} x_1, y_1 & \cdots & x_m, y_1 \\ \cdots & \cdots & \cdots \\ x_1, y_n & \cdots & x_m, y_n \end{bmatrix};$$

wherein during a scanning and stepping process of the two-dimensional worktop, when not modulated, there is a phase distribution W of the phases of the holographic grating substrate one-to-one corresponding to coordinate points in the second coordinate matrix H, the phase distribution W is represented by:

$$W = \begin{bmatrix} \phi_{(x_1,y_1)} & \cdots & \phi_{(x_m,y_1)} \\ \cdots & \cdots & \cdots \\ \phi_{(x_1,y_n)} & \cdots & \phi_{(x_m,y_n)} \end{bmatrix};$$

$\varphi$ is a phase modulation term and is a feedback of a phase control apparatus through a displacement measurement of the two-dimensional worktop; phases of the interference fringes are directionally modulated by changing frequencies of phase modulators, $\varphi$ is expressed as:

$$\varphi = \begin{bmatrix} \delta_{\varphi(1,1)} & \cdots & \delta_{\varphi(m,1)} \\ \cdots & \cdots & \cdots \\ \delta_{\varphi(1,n)} & \cdots & \delta_{\varphi(m,n)} \end{bmatrix};$$

after phase modulation, a phase distribution $W_n$ of modulated phases one-to-one corresponding to the coordinate points in the second coordinate matrix is represented by:

$$W_n = \begin{bmatrix} \phi_{(x_1,y_1)}+\delta_{\varphi(1,1)} & \cdots & \phi_{(x_m,y_1)}+\delta_{\varphi(m,1)} \\ \cdots & \cdots & \cdots \\ \phi_{(x_1,y_n)}+\delta_{\varphi(1,n)} & \cdots & \phi_{(x_m,y_n)}+\delta_{\varphi(m,n)} \end{bmatrix} = \Phi_{ph,e}(x,y),$$

wherein the phase distribution $W_n$ of the modulated phases is same as the phase distribution $\Phi_{ph,e}(x,y)$ of the predetermined phases;
the step of decomposing the phase distribution of the predetermined phases into the first coordinate matrix corresponding to phases of the holographic grating substrate in the point-to-point manner, exposing the coordinate points of the predetermined phases, different from the phases of the holographic grating substrate, in the first coordinate matrix on photoresist disposed on the surface of the holographic grating substrate by stepping, scanning, and exposure, and developing to obtain the grating mask comprises:
accurately positioning the holographic grating substrate of a predetermined size from an exposure start point to an exposure end point by the displacement measurement apparatus to obtain the second coordinate matrix of the holographic grating substrate; and
corresponding the predetermined phases for compensating the surface error of the holographic grating substrate one-to-one to the coordinate points in the second coordinate matrix of the holographic grating substrate, feeding back a position of the holographic grating substrate by the displacement measurement apparatus in real time, and scanning and exposing the photoresist on the surface of the holographic grating substrate by a scanning beam interference lithography system, and then developing the photoresist to obtain the grating mask after surface compensation modulation.

2. The method according to claim 1, wherein after the step of obtaining the phase distribution of the predetermined phases compensating for the surface error through the simulation calculation, the method further comprises a step:
pre-compensating phases of the surface error by using a scanning interference field exposure model, and forming a compensation table by pre-compensated phase values of the phases of the surface error.

3. A device for compensating a surface error of a holographic grating substrate having scan and exposure functions, comprising: a first reflector, a second reflector, a third reflector, a fourth reflector, a first phase modulator, a second phase modulator, a first beam splitter, a second beam splitter, a third beam splitter, the two-dimensional worktop, a reference mirror, a displacement detection apparatus, a phase detector, and a master controller;

wherein the device is configured to execute steps:

obtaining a surface error distribution diagram corresponding to the holographic grating substrate by detecting the surface error of the holographic grating substrate;

obtaining a phase distribution of predetermined phases compensating for the surface error through simulation calculation; and decomposing the phase distribution of the predetermined phases into a first coordinate matrix corresponding to phases of the holographic grating substrate in a point-to-point manner, exposing coordinate points of the predetermined phases, different from the phases of the holographic grating substrate, in the first coordinate matrix on photoresist disposed on a surface of the holographic grating substrate by stepping, scanning, and exposure, and developing to obtain a grating mask;

wherein a phase modulation principle of a scanning beam interference lithography system comprises:

interfering at beam waist positions of spatially filtered and collimated small-size Gaussian beams emitted by the scanning beam interference lithography system to form interference fringes; a phase of the interference fringes at a position (x,y) at time t is $\phi_{ph}(x,y,t)$, a total exposure after scanning and exposure is:

$$D(x,y)=A(x,y)\{1+\gamma \cos[2\pi/px+\Phi_{ph(x,y)}]\},$$

wherein $2\pi/px+\varnothing_{ph\ (x,y,t)}$ is an exposure phase distribution after stepping, scanning, and exposure, and $\Phi_{ph\ (x,y)}$ is a phase distribution related to $\varnothing_{ph\ (x,y,t)}$, and a value of $\varnothing_{ph\ (x,y,t)}$ is changed to obtain a predetermined phase distribution $\Phi_{ph\ (x,y)}$ of the surface of the holographic grating substrate;

detecting the surface error of the holographic grating substrate, and obtaining the phase distribution $\Phi_{ph,e\ (x,y)}$ of the predetermined phases compensating for the surface error through the simulation calculation:

$$\Phi_{ph,e}(x, y) = \begin{bmatrix} \phi_{(x_1,y_1)} & \cdots & \phi_{(x_m,y_1)} \\ \cdots & \cdots & \cdots \\ \phi_{(x_1,y_n)} & \cdots & \phi_{(x_m,y_n)} \end{bmatrix};$$

measuring a displacement of a two-dimensional worktop by a displacement measurement apparatus and obtaining a second coordinate matrix H of the holographic grating substrate:

$$H = \begin{bmatrix} (x_1, y_1) & \cdots & (x_m, y_1) \\ \cdots & \cdots & \cdots \\ (x_1, y_n) & \cdots & (x_m, y_n) \end{bmatrix};$$

wherein during a scanning and stepping process of the two-dimensional worktop, when not modulated, there is a phase distribution W of the phases of the holographic grating substrate one-to-one corresponding to coordinate points in the second coordinate matrix H, the phase distribution W is represented by:

$$W = \begin{bmatrix} \phi_{(x_1,y_1)} & \cdots & \phi_{(x_m,y_1)} \\ \cdots & \cdots & \cdots \\ \phi_{(x_1,y_n)} & \cdots & \phi_{(x_m,y_n)} \end{bmatrix};$$

φ is a phase modulation term and is a feedback of a phase control apparatus through a displacement measurement of the two-dimensional worktop; phases of the interference fringes are directionally modulated by changing frequencies of phase modulators, φ is expressed as:

$$\varphi = \begin{bmatrix} \delta_{\varphi(1,1)} & \cdots & \delta_{\varphi(m,1)} \\ \cdots & \cdots & \cdots \\ \delta_{\varphi(1,n)} & \cdots & \delta_{\varphi(m,n)} \end{bmatrix};$$

after phase modulation, a phase distribution $W_n$ of modulated phases one-to-one corresponding to the coordinate points in the second coordinate matrix is represented by:

$$W_n = \begin{bmatrix} \phi_{(x_1,y_1)}+\delta_{\varphi(1,1)} & \cdots & \phi_{(x_m,y_1)}+\delta_{\varphi(m,1)} \\ \cdots & \cdots & \cdots \\ \phi_{(x_1,y_n)}+\delta_{\varphi(1,n)} & \cdots & \phi_{(x_m,y_n)}+\delta_{\varphi(m,n)} \end{bmatrix} = \Phi_{ph,e}(x, y),$$

wherein the phase distribution $W_n$ of the modulated phases is same as the phase distribution $\Phi_{ph,e}(x,y)$ of the predetermined phases:

wherein a left exposure beam is reflected by the first reflector and the fourth reflector in sequence, passes through the first phase modulator, and passes through the first beam splitter to be divided into a first light beam and a second light beam; the first light beam is interfered and then enters the phase detector through the third beam splitter, and the second light beam in the left exposure beam is incident on the holographic grating substrate to form first interference fringes for exposure;

wherein a right exposure beam is reflected by the third reflector and the fourth reflector in sequence, passes through the second phase modulator, and passes through the second beam splitter to be divided into a third light beam and a fourth light beam; the third light beam is interfered and then enters the phase detector through the third beam splitter, and the fourth light beam is incident on the holographic grating substrate to form second interference fringes for exposure;

when the holographic grating substrate and the two-dimensional worktop move, the reference mirror and the displacement measurement apparatus position the two-dimensional worktop and detect the displacement of the two-dimensional worktop in real time;

wherein the master controller controls the first phase modulator and the second phase modulator to modulate phases of the first interference fringes and phases of the second interference fringes when the two-dimensional worktop performs stepping scanning motion to any point, so that phases of the modulated interference fringes meet the phase distribution of the predetermined phases of the interference fringes.

* * * * *